(12) United States Patent
Wolf

(10) Patent No.: US 6,424,185 B1
(45) Date of Patent: Jul. 23, 2002

(54) NCO BASED FREQUENCY SYNTHESIZER WITH JITTER MODULATION

(75) Inventor: Christopher K. Wolf, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/083,646

(22) Filed: May 22, 1998

(51) Int. Cl.[7] .............................. H03K 5/00; H03L 7/00
(52) U.S. Cl. ...................... 327/107; 327/156; 327/105; 708/270
(58) Field of Search ................. 327/156, 105, 327/144, 107, 106, 141; 371/62; 708/270, 271

(56) References Cited

U.S. PATENT DOCUMENTS

| | | | | |
|---|---|---|---|---|
| 5,179,348 A | * | 1/1993 | Thompson | 327/105 |
| 5,390,180 A | * | 2/1995 | Reilly | 375/105.1 |
| 5,394,106 A | * | 2/1995 | Black et al. | 327/107 |
| 5,487,183 A | * | 1/1996 | Nanni et al. | 455/113 |
| 5,673,212 A | | 9/1997 | Hansen | 364/718 |
| 5,828,678 A | * | 10/1998 | Mock | 371/621 |

OTHER PUBLICATIONS

James A. Crawford, *Frequency Synthesizer Design Handbook*, pp. 308–346 (1994).
Dr. Roland E. Best, *Phase–Locked Loops*, pp. 53–62, Copyright© 1984 by McGraw Hill, Inc.
Paul Horowitz, Winfield Hill, *The Art Of Electronics*, Second Edition, pp. 647–651, Copyright© 1980, 1989.

* cited by examiner

Primary Examiner—Dinh T. Le
(74) Attorney, Agent, or Firm—Skjerven Morrill LLP

(57) ABSTRACT

An improved synchronization circuit has a numerically controlled oscillator (NCO) having an accumulator, a number line, and feedback line fed back from the accumulator output. The accumulator repeatedly adds the number represented on the number line and the number represented on the feedback line and feedbacks the result to the accumulator. The result rolls over to zero as would an odometer when it reaches a maximum value. When the number represented on number input is properly selected by, for example, a microprocessor, a data stream representing the most significant bit of the result has jitter. The synchronization circuit also has a phase-locked loop (PLL) configured to receive the data stream of the most significant bit. The frequency of the most significant bit stream and the frequency of the jitter on that bit stream are controlled by the number at the number input. The number is chosen to maximize the jitter frequency and thus maximize jitter attenuation through the PLL.

14 Claims, 4 Drawing Sheets

NCO BASED FREQUENCY SYNTHESIZER WITH JITTER MODULATION

BACKGROUND OF THE INVENTION

1. Field of the Invention

The present invention relates to video processing. More specifically, it pertains to the minimization of jitter when decoding and presenting a multimedia data stream.

2. Discussion of the Related Art

One feature of many multimedia packages is the ability to receive and decode encoded video and audio data. Under real time operation, information must be decoded and represented on a display, speaker, and/or recording medium (VCR, etc.) at the same rate as it is received. However, as long as the system is not interactive, it can be represented to the viewer at a set reasonable time delay from the time the encoded data is received without the user noticing. The delay, however, must be consistently applied to both the audio and visual data. Therefore, the system must have a clock synchronized to the transmitter clock to ensure that the data is being represented on the display, speakers, and/or recording medium at the same rate as the data was transmitted. The system must also have a clock to ensure that the visual and audio components of the data are synchronized.

The problem of "jitter" complicates the synchronization process. Multimedia data representing, for example, a television show has been generated by a variety of recording devices, such as a camera, microphone, computer graphics generator, and so forth. Once the data is generated, an encoder encodes the data in order to reduce the bandwidth required for transmission. The data stream is encoded into a compressed data stream having recognized compression formats such as MPEG1, MPEG2, and so forth.

These data streams include program or system clock references (hereinafter "PCR"). These PCR's are reference points that the encoder inserts to indicate a reference to be used when calculating the time at which the data should be displayed. PCR time markers are placed within the MPEG data stream at, for example, ten per second. Therefore, in an ideal system, one would expect a PCR once every 0.1 seconds.

However, between the encoder and the decoder are a variety of processes that could either speed up or slow down the data rate of the transmitted data stream even though the data rate at the encoder is constant. This effect is referred to herein as "wander" if the variation is slow, and "jitter" if the variation is fast. For example, in a transmission involving a satellite link, data must be transmitted through a variety of different levels of atmosphere. The electromagnetic propagation behaves differently through each level of atmosphere causing the data to speed up or slow down. In this and other applications, it is possible that in processing the data stream between encoding and decoding, the data stream is multiplexed and demultiplexed. There is always some synchronization error in demultiplexing elements of a data stream back into that data stream. In general, these effects cause both wander and jitter.

Even with wander and jitter, the average speed at which data arrives over a long period of time is constant. Furthermore, the average rate at which data is consumed must equal the average rate at which the data arrives. However, input wander and jitter means that at any given point, the rate of data in the data stream could either be slightly higher or lower than the average speed. A higher input data rate increases the length of the queue holding the data to be displayed, leading in the worst case to data loss as a result of an overflowed buffer. A lower data rate may lead to the display running out of display data.

To avoid data loss, the receiver clock average frequency must equal the transmitter clock average frequency. However, jitter on the receiver clock can cause noise and color inaccuracy in the video signals displayed on a monitor, and can cause poor signal-to-noise ratios in delta-signal audio digital-to-analog converters (DAC's). Therefore, to avoid large queues in the receiver, the receiver clock tracks wander and rejects jitter.

One prior art method uses a fixed frequency clock to control the processing of the data stream. This fixed frequency clock does not track the actual input wander and thus the buffers risk overflow as described above. To prevent overflowing the buffers, the system simply removes the data. Instead of depleting the data in the buffers, the system simply withholds displaying any data within the buffers until more data has arrived. However, it is well known how to construct a fixed-frequency oscillator that generates very little jitter.

In a video context, the above prior art method results in occasional repeating or skipping of frames that gives rise to jerky motion in the video sequence. However, in an audio context, audio portions are removed or repeated, resulting in pops and clicks in the audio signals. Therefore, what is desired is a circuit and method for tracking wander without skipping or repeating data to enable smoother presentation of video and a higher fidelity presentation of audio.

FIG. 1 illustrates a prior art circuit for system frequency synthesis in which skipping or repeating data is not necessary. Prior art synthesizer 40 includes a transport demultiplexer 44 receiving a data stream 42 and providing a transport demultiplexer output data stream 46; a processor 48 receiving the transport demultiplexer output data stream 46 and a local timer output signal 62 and providing a processor output signal 50; a digital-to-analog converter (DAC) 52 receiving processor output signal 50 and providing a DAC output signal 54; a voltage control crystal oscillator (VCXO) 56 receiving DAC output signal 54 and providing a VCXO output signal 58; and a local timer 60 receiving VCXO output signal 58 and providing local timer output signal 62.

Processor 48 receives transport demultiplexer output data stream 46's time marker and a local time when the time marker was received from local timer output signal 62. Processor 48 compares these input signals to determine how much the system clock needs to speed up or slow down to properly synchronize with the transport demultiplexer output data stream 46. Processor 48 outputs an appropriate instruction in processor output signal 50 to DAC 52 where the instruction is converted to a form recognizable by VCXO 56. DAC 52 sends the instruction in DAC output signal 54 to VCXO 56 and VCXO 56 responds by increasing or decreasing the frequency of the clock signals sent over VCXO output signal 58 to local timer 60, thus completing the loop.

This configuration suffers from several disadvantages. First, VCXO 56 generates more jitter than fixed-frequency oscillators. Second, VCXO 56 is very difficult to Control. There are non-linearities within both DAC 52 and VCXO 56 thereby limiting the ability to adjust local timer 60 in response to jitter detected within transport demultiplexer 44. Third, the system provides for little attenuation of jitter introduced within the local control system. Fourth, VCXO 56 requires that the capacitance across a crystal be changed in response to a control signal, which makes them expensive to implement on a single integrated circuit. Therefore, what is desired is a circuit and method for synchronizing a local clock to a data stream to improve synchronization control and jitter attenuation.

SUMMARY OF THE INVENTION

The present invention provides a circuit and method for synchronizing a local clock to a data stream to compensate for input jitter and limit internally generated jitter. A synchronization circuit has a numerically controlled oscillator (NCO). The NCO has an accumulator and receives two input values, a number and a feedback value fed back from the output of the accumulator. Thus, the accumulator is configured to repeatedly add the number to the feedback value and output the result as an accumulator output with each clock cycle. The synchronization circuit includes a phase-locked loop (PLL), which receives the output value of the accumulator and attenuates high frequency jitter. The number made available to the accumulator is selected so as to maximize the jitter frequency of the accumulator output. As a low pass filter, the PLL filters out the high frequency jitter.

A method for synchronizing is also provided. The method increments a first variable by a second variable resulting in a sum. A most significant bit of the remainder of the sum when divided by a maximum value is output to a phase-locked loop.

The principles of the present invention will best be understood in accordance with the following detailed description and in accordance with the claims.

DETAILED DESCRIPTION OF THE PREFERRED EMBODIMENT

Figure 1:
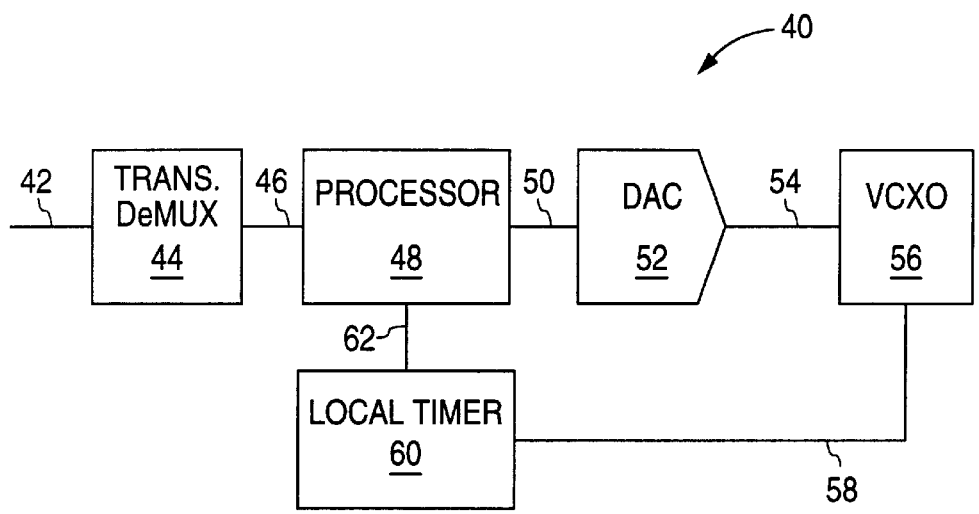
FIG. 1 illustrates a prior art circuit for system frequency synthesis such that skipping or repeating data is not necessary.
Figure 2:
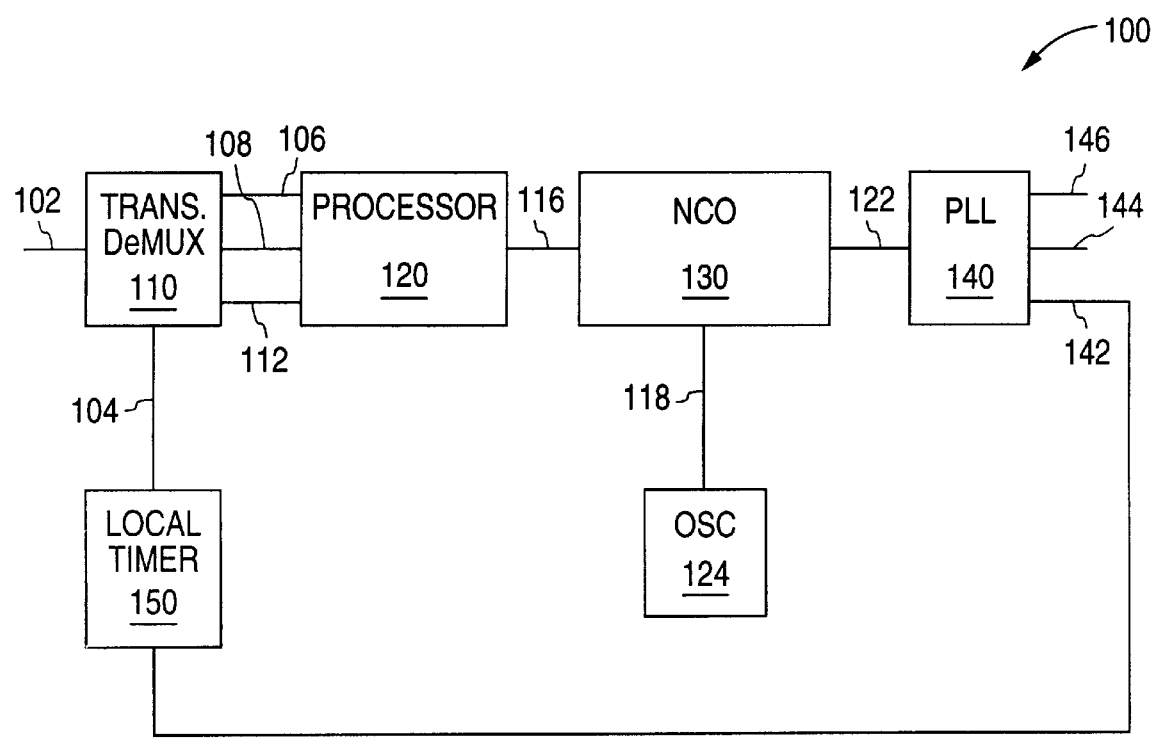
FIG. 2 is a block diagram of a frequency synthesizer according to one embodiment of the invention.

FIG. 2 is a block diagram of a frequency synthesizer 100 according to one embodiment of the invention. Synthesizer 100 includes a transport demultiplexer 110 configured to receive a data stream on data stream line 102 and to receive an capture time signal on input timer line 104 and configured to provide a PCR signal, a count signal, and an output timer signal on PCR line 106, count line 108, and capture time line 112, respectively. Synthesizer 100 further includes a processor 120 configured to receive the PCR signal of PCR line 106, the count signal of count line 108, and the capture time signal of capture time line 112 and configured to provide a numerically controlled oscillator (NCO) signal on an NCO line 116. Synthesizer 100 further includes NCO 130 configured to receive the NCO signal of NCO line 116 and to receive a clock signal generated by fixed oscillator 124 on oscillator line 118 and configured to provide a most significant bit (MSB) signal on MSB line 122. Synthesizer 100 further includes a phase-locked loop (PLL) 140 that is configured to receive the MSB signal of MSB line 122 and provide PLL output signals on respective PLL output lines (142, 144, and 146). Synthesizer 100 further includes a local timer 150 configured to receive the PLL output signal on PLL output line 142 and configured to provide the capture time signal on input timer line 104.

The operation of transport demultiplexer 110 is now described below. Transport demultiplexer 110 receives the data stream that, in one embodiment, is a stream of compressed multimedia audio/visual data. The compression format of the data stream contains time markers such as PCR's or SCR's as does MPEG1 and MPEG2. Transport demultiplexer 110 demultiplexes the audio and visual data to separate components (not shown) for decoding and processing.

When a PCR is received in the data stream on data stream line 102, transport demultiplexer 110 compares the time indicated by the PCR to the local time indicated by the capture time signal of timer line 104. However, since only ten PCR signals are received per second, processor 120 interpolates for finer timing resolution in the data stream between arrivals of PCR's using count line 108 that transport demultiplexer 110 increments for every bit on input data stream line 102.

The interpolation performed by processor 120 are provided as follows. Transport demultiplexer 110 keeps track of the number of bits of information within the data stream between neighboring PCR's. For example, in a data stream having a bit flow rate of 50,000 bits per second (BPS) in which a PCR appears every 0.1 seconds, there is approximately 5000 bits of data between two successive PCR's. A counter in transport demultiplexer 110 keeps track of how many bits have been received since the last PCR was received. If, for example, a PCR appears every 0.1 seconds, a time resolution of 0.01 seconds is needed, and the last PCR indicated a time of 1.300 seconds relative to a first PCR that correlated to a local time of one O'clock, after 500 bits have been received, transport demultiplexer 110 advances the local time to 1:00.01.310 (one O'Clock, zero minutes, 1.310 seconds) even though the next actual PCR does not arrive at transport demultiplexer 110 until 1:00.01.400.

Upon receiving each PCR, transport demultiplexer 110 sends the time value to processor 120 over PCR line 106. Furthermore, at each time point at which transport demultiplexer 110 has counted 500 bits or at each time point at which transport demultiplexer 110 receives a PCR, transport demultiplexer 110 compares the local time represented by the capture time signal. The captured local time is sent as the capture time signal on capture time line 112 along with a count value sent as the count signal on count line 108 indicating that this time corresponds to a 500 bit increment.

Jitter creates time error between the local timer 150 a data stream 102. Processor 120 receives the PCR, count, and local time represented by PCR signal, count signal, and capture time signal, respectively, and calculates a time error of the data stream according to the following equation 1:

$$E = PCR_{last} + (PCR_x - PCR_{x-1}) \times [k/(K_{x\ to\ x-1})] - C \qquad (1)$$

where:

"E"=time error,

"$PCR_{last}$"=time of the most recent PCR,

"$PCR_x$"=time of a PCR,

"$PCR_{x-1}$"=time of another $PCR_x$,

"k"=bits received after $PCR_{last}$,

"$K_{x\ to\ x-1}$"=bits between $PCR_x$ and $PCR_{x-1}$,

"C"=local time when "k"th bit arrives, and

For example, if there are nominally 5000 bits between two successive PCR's, the last PCR correlated to a time of 1:00.03.400, there are 2500 bits received since the last PCR, and the local time at the 2500th bit is 1:00.03.447, then a time error can be calculated by (1:00.03.400)+ (0:00.00.100)×(2500/5000)−(1.00.03.447) which equals a positive 3 microsecond time error. Therefore, transport demultiplexer 110 and processor 120 are configured to determine the time error of a data stream in relation to a local clock between successive PCR'S.

After the time error is determined and filtered by a standard closed-loop control algorithm, processor 120 provides the number value of NCO signal to NCO 130 over NCO line 116. The value of this number controls the output frequency of synthesizer 100 as explained below.

Figure 3:
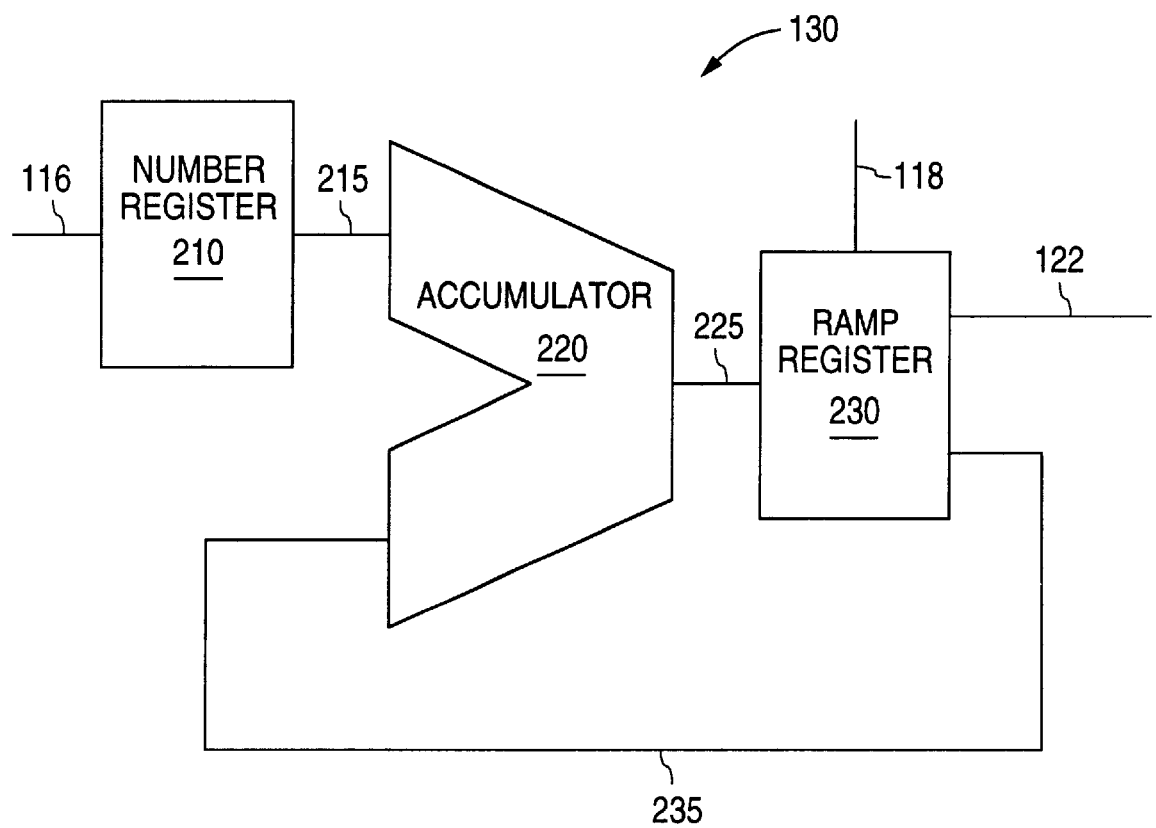
FIG. 3 is a detailed schematic diagram of NCO 130 of FIG. 2.

FIG. 3 is a detailed schematic diagram of NCO 130 of FIG. 2. NCO 130 includes a number register 210 configured to receive the NCO signal on NCO line 116 and configured to provide a number signal on number line 215. NCO 130 further includes an accumulator 220 configured to receive the number signal and configured to provide an accumulator output signal on accumulator output line 225. NCO 130 further includes a ramp register 230 configured to receive the accumulator output signal and the clock signal and configured to provide a feedback signal on feedback line 235 and an MSB signal on MSB line 122. Feedback line 235 is a second input to accumulator 220.

Figure 4:
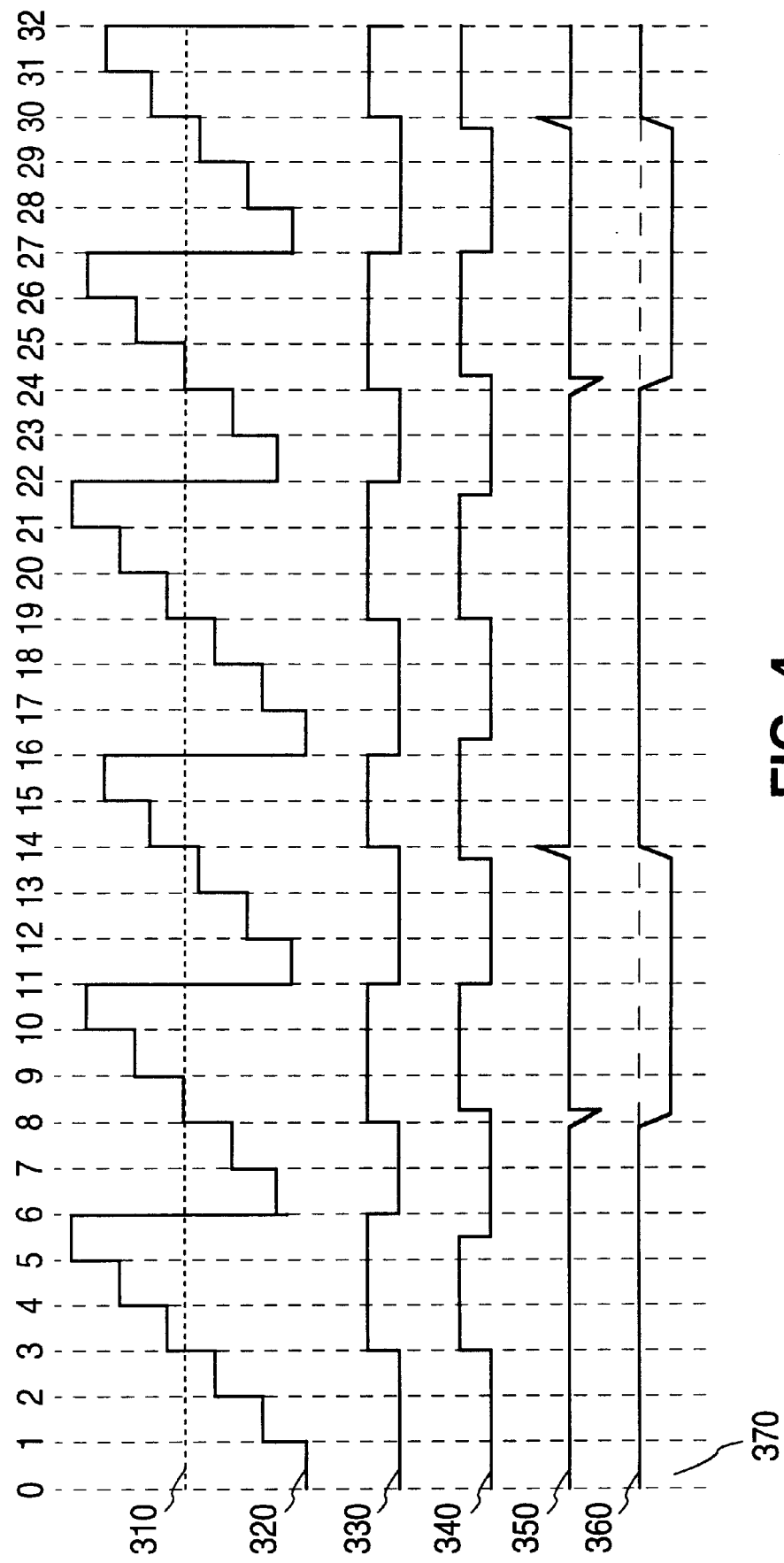
FIG. 4 is a signal timing reference chart for NCO 130.

The operation of NCO 130 is described with reference to FIGS. 3 and 4. FIG. 4 is a signal timing reference chart for NCO 130. FIG. 4 shows 33 time reference signals (times 0–32) which mark time points that ramp register 230 receives a rising edge the clock signal on oscillator line 118. A ramp register value 320 represents the value in ramp register 230 and is shown with reference to a MSB threshold line 310. The chart also shows an actual MSB value 330, an MSB reference value 340, a phase error value 350, a jitter threshold value 360, and a jitter value 370.

In one embodiment, registers (210 and 230) are 32 bit registers. In the preferred embodiment, registers (210 and 230) are at least 16 bit registers. However, the principles of the present invention still apply for smaller registers. For clarity, registers (210 and 230) are described as 8-bit registers capable of storing fractions in denominations of 1/16 such that registers (210 and 230) are capable of storing numbers from zero (0000.0000 in binary) to 15.9375 (1111.1111 in binary) in increments 0.0625 (1/16). If the value of the number in ramp register 230 is from zero to 7.9375 (from 0000.0000 to 0111.1111 in binary), the most significant bit of ramp register 230 is zero and if the value of the number in ramp register 230 is from 8 to 15.9375 (from 1000.0000 to 1111.1111 in binary), the most significant bit of ramp register 230 is one. MSB value 330 is the most significant bit of ramp register 220.

Number register 210 provides the value of the number signal on number line 215. Initially, ramp register 230 has a value of, for example, zero. The value within ramp register 230 is represented in the feedback signal, which is fed back to number register 210 over feedback line 235. Accumulator 220 adds the two input values and outputs the sum represented in the accumulator output signal on accumulator output line 225. At time 1, the clock signal on oscillator line 118 causes ramp register 230 to write the value of the accumulator output signal and read that value back to accumulator 220 over feedback line 235. Thug, for each cycle of the clock signal generated-by fixed oscillator 124, ramp register value 320 is incremented by the value within number register 210.

In the example of FIG. 4, immediately after time 1, ramp register value 320 is less than MSB threshold line 310. MSB threshold line 310 is defined as the value of ramp register value 320 needed for the most significant bit of ramp register 230 to be a binary one. After time 1 and time 2 of FIG. 4, ramp register value 320 still does not exceed the MSB threshold line 310. Therefore, at time 1 and time 2, actual MSB value 330 is still zero.

However, at time 3, ramp register 210 loads in the accumulator output signal line 325 that now exceeds MSB threshold line 310. Thus, the value of the MSB signal on MSB line 122 (actual MSB value 330) become a binary one. This binary one continues until time 6.

At time 6, the sum of the value in number register 210 and the value on the feedback line exceeds the range of the register (exceeds 15.9375). In this situation, the numbers merely roll over as would an odometer on an automobile. In other words, the most significant digit having a binary one value of the binary representation of the sum is dropped. For example, if 0000.0010 was added to 1111.1111, the new sum would be 0000.0001. Therefore, ramp register value 320 drops precipitously at time 6 to a number slightly above zero. Note that if the value range of ramp register 230 is a multiple of the value in number register 210, the ramp register value 320 drops to zero.

FIG. 4 shows this process repeated for 32 clock cycles. Ramp register value 320 rises and drops in a stepped saw tooth pattern. As apparent from FIG. 4, actual MSB value 330 is a binary square wave with a binary zero value when ramp register value 320 is less than MSB threshold line 310 and a binary one when ramp register value 320 is more than MSB threshold line 310.

MSB reference value 340, phase error value 350 and jitter value 370 are not actually signals that are created by NCO 130 but are helpful in the understanding of the principles of the present invention. Actual MSB value 330 has periods of binary zero and binary one that are not necessarily equal in length. However, there is an average frequency and average square wave pulse length. These averages are represented by MSB reference value 340.

Jitter threshold value 360 is shown with a dotted line and represents a zero jitter condition. Jitter value 370 represents the actual jitter of the leading edge of each square wave for actual MSB value 330 compared to the leading edge of each corresponding square wave for MSB reference value 340. For example, at time 8, the leading edge of a square wave pulse for actual MSB value 330 and a corresponding pulse leading edge of MSB reference value 340 occur simultaneously. Thus from time 8 until the next leading edge of a square wave of actual MSB value 330 (time 14), jitter is zero. The leading edge of a square wave pulse in actual MSB value 330 occurs at time 14. The leading edge for the corresponding reference square wave pulse occurs almost one full clock cycle before (just after Lime 11) which represents a large negative jitter of approximately minus two thirds of a cycle. This large negative jitter is apparent in jitter value 370 from time 14 until time 19. At the leading edge of actual MSB value 330 square wave pulse at time 19, MSB reference value 340 square wave occurs only slightly before time 19 resulting in a moderate negative value of jitter value 370 of approximately minus one third of a cycle. This moderate negative jitter value last from time 19 until time 24 where the jitter wave of jitter value 370 repeats. Thus, apparently the jitter also has a frequency. The period of the jitter value 370 is, for example, 16 cycles (time 8 to time 24, for example). Thus jitter value 370 has a frequency of 1/16 times the frequency of the clock signal generated by fixed oscillator 124.

Note that this jitter is not the same jitter that arrives in the data stream. Jitter value 370 is created out of the operation of NCO 130 which varies the speed of the local timer to respond to the wander in the data stream. The NCO jitter frequency is defined by the following equations 2 and 3:

$$f_{jitter} = f_{NCO} \times \text{fract}(f_{OSC}/f_{NCO}), \text{ if fract}(f_{OSC}/f_{NCO}) <= 0.5 \quad (2)$$

$$f_{jitter} = f_{NCO} \times \text{fract}(1-(f_{OSC}/NCO)), \text{ if fract}(f_{OSC}/f_{NCO}) > 0.5 \quad (3)$$

where:

$f_{jitter}$=frequency of jitter value 270, $f_{OSC}$=frequency of the clock signal of fixed oscillator 124, and $f_{NCO}$=frequency of actual MSB value 330.

As apparent from these equations and from the above discussion, there is no jitter when the frequency of the clock signal of fixed oscillator 124 is a multiple of the frequency of actual MSB value 330. On the other hand, the jitter frequency is half the actual MSB value 330 frequency if the fixed oscillator 124 clock frequency is an integer plus one half of the frequency of actual MSB value 330. Thus, the jitter can range from a frequency of zero to a frequency of one half of the actual MSB 330 frequency.

Furthermore, the value of the ratio ($f_{OSC}/f_{NCO}$) is controlled by the number in the number register according to the following equation 4.

$$(f_{OSC}/f_{NCO}) = RRR/\text{number} \quad (4)$$

where;

RRR=ramp register 230 range, and number=number in number register 210.

"Range" is defined as the largest possible number in ramp register 230 minus the smallest possible number in ramp register 230 plus the increment of the least significant digit of ramp register 230. For example, suppose ramp register 230 is configured to store numbers from zero (0000.0000) to 15.9375 (1111.1111) in units of 0.0625 (0000.0001), the range of ramp register 230 is calculated by 15.9175−0+0.0625 which equals 16.

Thus, the actual jitter frequency can be controlled by the number in number register 210. Table 1 is derived from equations (2), (3), and (4) and shows how the number of number register 210 relates to the actual MSB frequency which would result in a zero jitter frequency if, for example, ramp register 230 is an eight bit register configured to hold values from 0 to 15.9375.

TABLE 1

| Number register 210 value | Binary Register Representation | $f_{OSC}/f_{NCO}$ | $f_{jitter}/f_{NCO}$ |
| --- | --- | --- | --- |
| 0 | 0000.0000 | ∞ | 0 |
| 0.0625 (1/16) | 0000.0001 | 256 | 0 |
| 0.125 (1/8) | 0000.0010 | 128 | 0 |
| 0.25 | 0000.0100 | 64 | 0 |
| 0.5 | 0000.1000 | 32 | 0 |
| 1. | 0001.0000 | 16 | 0 |
| 2. | 0010.0000 | 8 | 0 |
| 4. | 0100.0000 | 4 | 0 |
| 8. | 1000.0000 | 2 | 0 |

On the other hand, the following table 2 shows a representative sample of what values of number register 210 results in a high ratio of jitter to NCO frequency.

TABLE 2

| Number register value | Binary Register Representation | $f_{OSC}/f_{NCO}$ | $f_{jitter}/f_{NCO}$ |
| --- | --- | --- | --- |
| 0.4375 (7/16) | 0.000.0111 | 36.571 | 0.429 |
| 0.5625 (9/16) | 0000.1001 | 28.444 | 0.444 |
| 0.625 (10/16) | 0000.1010 | 25.6 | 0.400 |
| 1.1875 (19/16) | 0001.0011 | 13.474 | 0.474 |
| 1.6875 (27/16) | 0001.1011 | 9.481 | 0.481 |
| 1.875 (30/16) | 0001.1110 | 8.533 | 0.467 |
| 2.125 (34/16) | 0010.0010 | 7.529 | 0.471 |
| 2.4375 (39/16) | 0010.0111 | 6.564 | 0.436 |
| 3.5625 (57/16) | 0011.1001 | 4.491 | 0.491 |

Even more refined selections of $f_{OSC}/f_{NCO}$ and $f_{jitter}/f_{NCO}$ are possible when number register 210 and ramp register 230 are 16 or 32 bit registers. Thus, the number in number register 210 is carefully selected by processor 120 to get the optimal $f_{NCO}$ and $f_{jitter}$.

Processor 120 varies the NCO signal on NCO line 116 from its nominal value in order to track wander on the input data stream 102. Therefore, processor 120 is not able to keep the $f_{OSC}/f_{NCO}$ ratio exactly equal to an integer.

Actual MSB value 330 is sent within MSB signal on MSB line 122 to PLL 140. PLL's are well known in the art as being able to multiply the frequency of an input data stream. Furthermore, PLL's act as a low pass filter for jitter frequency. By selecting the number in a 32 bit number register 210 appropriately, such that $f_{jitter}$ is relatively high, jitter is attenuated in a low pass filter (not shown) of PLL 140. The result is that the frequency on PLL output lines (142, 144, and 146) is multiplied by a factor and is be relatively free of jitter.

A PLL itself is a circuit that is well known in the art for being a frequency multiplier. For example, it receive a 10 MHz input frequency and create a 80 MHz output frequency. The application of a PLL as a frequency multiplier is described in *The Art of Electronics*, pages 647–651 (ISBN number 0-521-37095-7) which is incorporated by reference in its entirety. Thus, PLL 140 is configured to act to multiply the frequency of actual MSB value 330 by a factor.

However, PLL 140 also acts as a low pass filter for jitter. The actual jitter attenuation module within PLL 140 is the low pass filter. A discussion of the phase jitter attenuation characteristics of PLL's is given from page 53 to page 59 of *Phase Locked Loops Theory, Design, and Applications* (ISBN number 0-07-005050-3), which is incorporated herein by reference in its entirety.

As described above, to remove jitter from the MSB signal on MSB line, the frequency of the jitter is chosen to be high by choosing an appropriate number to be input into number register 210 as described above. Thus, substantially all of the jitter in the MSB signal of MSB line 122 is eliminated by PLL 140 in its function as a low pass jitter filter.

The existence of low frequency components in the jitter, even if most frequency components are within the attenuation band of PLL 140, may restrict choice for $f_{NCO}$. The lowest jitter frequency component is defined by equation (5).

$$f_{jitter,low} = f_{OSC}/D \quad (5)$$

where D is the denominator from the reduced version of the fraction $n/2^W$, n is the number on the NCO input line 116, and W is the width of the NCO ramp register 230 in bits.

A reduced fraction is one in which there are no common multiplicative factors between the numerator and the denominator. For example, the reduced version of ⅔ is ⅓.

For example, if the NCO ramp register 230 width is 4 bits and the NCO input number is 3, the output frequency $f_{NCO}$ is the same as the oscillator frequency $f_{OSC}$ times 3/16. As can be seen by FIG. 4, the lowest frequency component of the jitter is $f_{OSC}/16$. Every 16 oscillator cycles, the pattern created by the state of the NCO output repeats. If the phase detector used in the PLL is sensitive to rising edges only, then the pattern length corresponds to the lowest frequency component of the jitter, or phase error signal.

Figure 5:
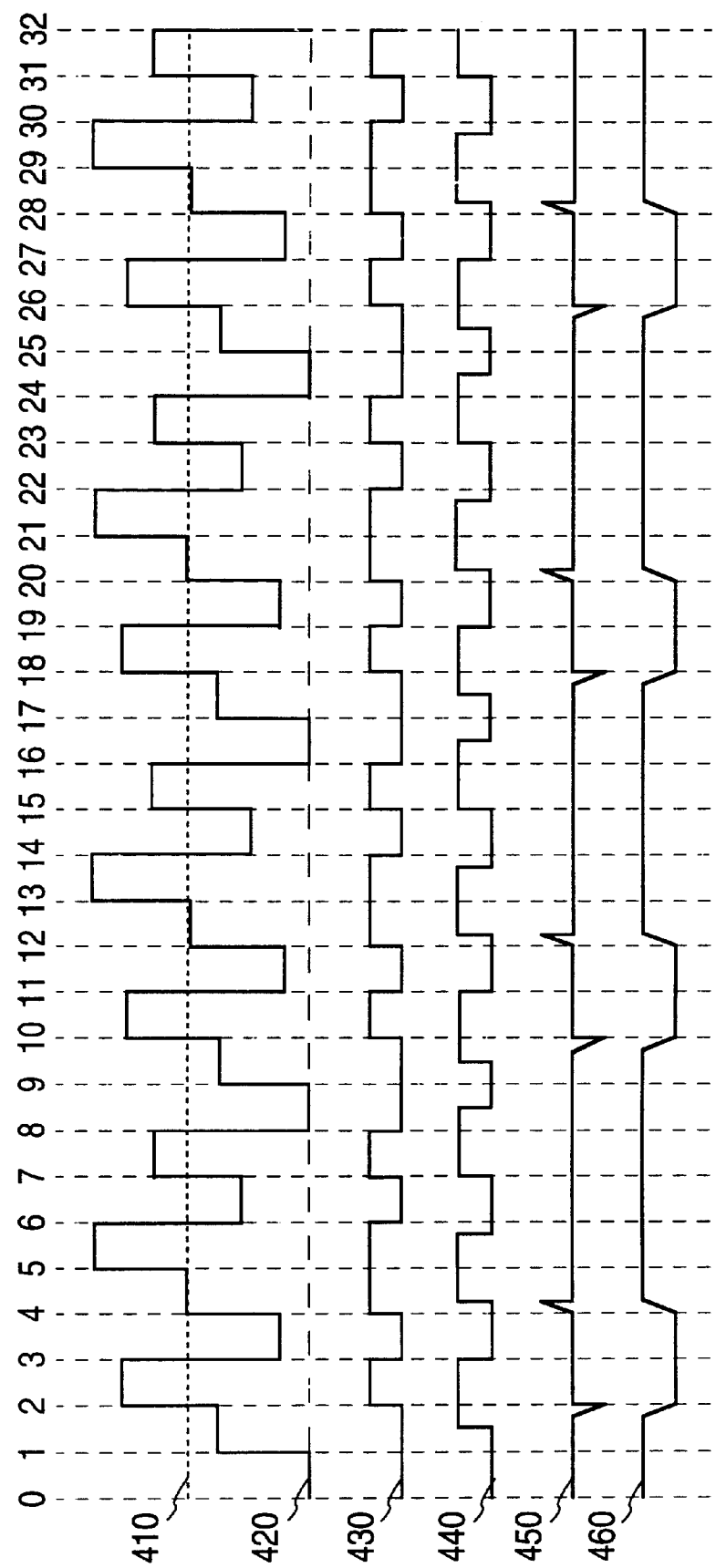
FIG. 5 is a signal timing reference chart illustrating jitter wave forms at frequencies below a PLL attenuation band.

FIG. 5 shows a signal timing chart resulting from a 4 bit NCO ramp register 230 in which the input number is 6. The signals 420, 430, 440, 450, and 460 correspond to signals 320, 330, 340, 350, and 360 of FIG. 4. The output frequency is defined by equation (6).

$$f_{NCO}=f_{OSC}*6/16=f_{OSC}*3/8 \quad (6)$$

In the example of FIG. 5, the lowest frequency $f_{jitter,low}$ of the jitter is defined by equation (7).

$$f_{jitter,low}=f_{OSC}/8 \quad (7)$$

Note, from FIG. 5, that the highest jitter component frequency is at $f_{OSC}/2$, and the lowest jitter component frequency is at $f_{OSC}/8$. When the PLL 140 is locked to the NCO output, the phase integration characteristics of the voltage controlled oscillator in PLL 140 changes the phase of the reference with respect to the NCO signals such that positive phase error events have an equal amplitude as the negative phase error events. The jitter wave form then corresponds to a pulse-train.

Thus, the frequencies of the clock signals on PLL output lines (142, 144, and 146) are configured to be varied depending on the number that is within number register 210 and the frequency of fixed oscillator 124. Therefore, when processor 120 determines that synthesizer 100 is lagging behind the data stream, synthesizer 100 slightly speeds up the system by processor 120 outputting a specific number into number register 210. This number in number register 210 causes the clock signals on PLL output lines (142, 144, and 146) to be slightly faster than the frequency dictated by the PCR's in the data stream. This causes synthesizer 100 to catch up with the data stream to reduce time error to zero.

Similarly, when processor 120 determines that synthesizer 100 is leading ahead of the data stream, synthesizer 100 slightly slows downs the system by processor 120 outputting a specific number into number register 210. This number in number register 210 causes the clock signals on PLL output lines (142, 144, and 146) to be slightly slower than the frequency dictated by the PCR's in the data stream. This causes synthesizer 100 to let the data stream catch up with synthesizer 100 to reduce time error to zero.

Local timer 150 is controlled by the clock cycles of the PLL output signal out PLL output line 142. Therefore, local timer 150 also speeds up and slows down depending on the number within number register 210, thus completing the feedback loop. Note that further frequency multipliers can be connected to PLL output lines (142, 144, and 146) depending on the intended use for the clock signals on each of these lines. For example, PLL output line 142 may be for a pixel clock, PLL output line 144 for a memory clock, and PLL output line 146 for an audio clock.

Preferably, number register 210 and ramp register 230 are large enough that they are capable of storing numbers precise enough that the actual viewed frames are only slightly below or above the intended frame and audio frequency. For example, the speeding up and slowing down of the system to synchronize to the data stream with jitter is so slight, that the consumer is not able to detect that the video and audio speed are being varied at all. If fixed oscillator 124 has a clock frequency of approximately 14 MHz, a 32 bit register would enable this.

What the consumer does notice, however, is skipping and repeating of sound and image data. The principles of the present invention avoid skipping and repeating of frames and audio. Thus, the principles of the present invention improve the video and audio quality within a multimedia system.

Therefore, the principles of the present invention allow for the speed adjustment of data processing such that jitter in the received data stream is compensated for. Furthermore, jitter within the system is also attenuated using a PLL. In one embodiment, the frequency of the clock cycle of fixed oscillator 124 is approximately 33 MHz and the frequency of PLL output lines (142, 144, and 146) are approximately 135 MHz. The PLL output signal on PLL output line 142 is fed into a frequency divider (not shown) having a division factor of five to create a pixel clock frequency of 27 MHz. The PLL output signal on PLL output line 144 is coupled to a frequency divider having a division factor of two to create a memory clock frequency of 67.5 MHz.

In this embodiment, the actual MSB value 330 frequency is set with the number in number register 210 such that the fixed oscillator frequency is 14.5 times the actual MSB value 330 frequency. For example, the actual MSB value 330 frequency is approximately 2.27586 MHz (33 MHz/14.5). In order to obtain the PLL output frequency of 135 MHz, PLL 140 must have a feedback divider ratio of 59 (2.27586 MHz×59). Given the actual MSB value 330 frequency of 2.27586 MHz, fixed oscillator 124 frequency of 33 MHz, sampling frequency of 60 Hz, and a goal of $6.25 \times 10^{-6}$ parts/sec maximum rate of change in frequency, NCO 130 must have at least 31 bits for a pixel clock resolution finer than 0.2 Hertz. These parameters provide a system in which video jitter is not perceived by a consumer.

Accumulator 220 has been described as being a separate element to number register 210 and ramp register 230. However, it would be apparent in light of this disclosure that one or both of these registers may be integrated with accumulator 220.

Processor 120 has been described as being configured to determine a time error and calculate an appropriate number to output to number register 210 in order to adjust the time error to zero. It is apparent in light of this disclosure that the time error and number can be determine using hardware components and/or software components. Furthermore, the number could be determined, for example, using a look up table using a rounded time error as an input.

In the above description, the clock signal on oscillator line 118 has been described as being received by NCO 130 at ramp register 230. However, the present invention also operates if the clock signal is received by one or more of the other elements of NCO 130.

Although the principles of the present invention have been described with reference to specific embodiments, these embodiments are illustrative only and not limiting. Many other applications and embodiments of the principles of the present invention will be apparent in light of this disclosure and the following claims.

I claim:
1. A circuit comprising;
   a processor receiving a local timing signal and an input signal having embedded therein a program timing signal, and providing a first numerical signal representing a time difference between a time represented in said local timing signal and a time represented in said program timing signal;

a numerically controlled oscillator comprising an accumulator comprising:

a first input line receiving said first numerical signal;

a second input line providing a second numerical signal representing a second numerical value at said first time; and an output line coupled to said second input line, wherein said accumulator is configured to add said first and second numerical values and output a resulting signal representing a resulting value on said output line; and a phase-locked loop circuit coupled to said output line, said phase-locked loop including a low-pass filter capable of attenuating a jitter in said numerically controlled oscillator resulting from said first numerical signal.

2. The circuit of claim 1, further comprising an oscillator comprising an oscillator line coupled to said numerically controlled oscillator and configured to drive said oscillator line with a clock signal.

3. The circuit of claim 2, wherein said accumulator is configured to repeatedly add said first and second numerical values in response to said clock signal.

4. The circuit of claim 1, wherein said numerically controlled oscillator further comprises a number register coupled to said first input line, said number register configured to store said first numerical value.

5. The circuit of claim 4, wherein said numerically controlled oscillator further comprises an accumulation register coupled to said accumulator at said output line, said accumulation register configured to store said resulting value.

6. The circuit of claim 5, wherein said output line comprises a most significant bit line coupled to said phase-locked loop, said most significant bit line providing the most significant bit of said resulting value.

7. The circuit of claim 4, wherein said number register and said accumulation register are each configured to store a predetermined number of bits.

8. The circuit of claim 7, wherein said predetermined number of bits is sixteen or more bits.

9. The circuit of claim 8, wherein said predetermined number of bits is thirty two or more bits.

10. The circuit of claim 1, wherein said phase-locked loop comprised a plurality of phase-locked loop output lines.

11. A method of synchronizing in a multimedia system, comprising the steps of:

computing a corrective value for adjusting a frequency of a phase-locked loop;

accumulating said corrective value in an accumulator over a number of clock periods to obtain a resulting value represented by a predetermined number of bits; and transmitting a selected one of said bits as a corrective signal to said phase-locked loop, said phase-locked loop having a low-pass filter capable of attenuating a jitter resulting in said multimedia system from said corrective value.

12. The method of claim 11, wherein said selected one of said bits is the most significant bit of said resulting value.

13. The method of claim 12, further comprising the step of altering said corrective value to control said frequency.

14. The method of claim 13, further comprising the steps of:

maintaining a local time reference in said multimedia system;

reading a program clock reference embedded in a data stream;

reading said local time reference when said program clock reference is received;

comparing said program clock reference to said local time reference to determine a time difference by which said local time reference is ahead or behind said program clock reference; and performing said altering step based on said time difference.

* * * * *